US012769612B2

(12) United States Patent
Nale et al.

(10) Patent No.: US 12,769,612 B2
(45) **Date of Patent: *Oct. 20, 2026**

(54) MEMORY CHIP WITH PER ROW ACTIVATION COUNT HAVING ERROR CORRECTION CODE PROTECTION

(71) Applicant: Intel Corporation, Santa Clara, CA (US)

(72) Inventors: Bill Nale, Livermore, CA (US); Kuljit S. Bains, Olympia, WA (US); Lawrence D. Blankenbeckler, Cary, NC (US); Ronald Anderson, Columbia, SC (US); Jongwon Lee, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 43 days.

This patent is subject to a terminal disclaimer.

(21) Appl. No.: 18/952,668

(22) Filed: Nov. 19, 2024

(65) Prior Publication Data

US 2025/0077352 A1 Mar. 6, 2025

Related U.S. Application Data

(63) Continuation of application No. 17/339,754, filed on Jun. 4, 2021, now Pat. No. 12,164,373.

(51) Int. Cl.

*G06F 11/30* (2006.01)
*G06F 11/10* (2006.01)
(Continued)

(52) U.S. Cl.

CPC .... *G06F 11/1068* (2013.01); *G11C 11/40611* (2013.01); *G11C 11/4096* (2013.01)

(58) Field of Classification Search

None
See application file for complete search history.

(56) References Cited

U.S. PATENT DOCUMENTS

2014/0085995 A1* 3/2014 Greenfield ............... G11C 7/24 365/201
2015/0109871 A1 4/2015 Bains et al.
(Continued)

OTHER PUBLICATIONS

Extended European Search Report for Patent Application No. 22163660.8, Mailed Feb. 3, 2023, 9 pages.
(Continued)

*Primary Examiner* — Mujtaba M Chaudry
(74) *Attorney, Agent, or Firm* — Compass IP Law PC

(57) ABSTRACT

A memory chip is described. The memory chip includes storage cells along a row of the memory chip's storage cell array to store a count value of the row's activations and error correction code (ECC) information to protect the count value. The memory chip includes ECC read logic circuitry to correct an error in the count value. The memory chip includes a comparator to compare the count value against a threshold. The memory chip includes circuitry to increment the count value if the count value is deemed not to have reached the threshold and ECC write logic circuitry to determine new ECC information for the incremented count value, and write driver circuitry to write the incremented count value and the new ECC information into the storage cells. The memory chip includes circuitry to cause the row to be refreshed if the count value is deemed to have reached the threshold.

20 Claims, 6 Drawing Sheets

(51) Int. Cl.
*G11C 11/406* (2006.01)
*G11C 11/4096* (2006.01)

(56) References Cited

U.S. PATENT DOCUMENTS

| | | | | |
|---|---|---|---|---|
| 2019/0065079 | A1 | 2/2019 | Lee et al. | |
| 2019/0066808 | A1 * | 2/2019 | Nale | G11C 11/406 |
| 2022/0068348 | A1 * | 3/2022 | Bennett | G11C 11/4096 |
| 2022/0113868 | A1 * | 4/2022 | Cowles | G06F 3/0653 |

OTHER PUBLICATIONS

Notice of Allowance for U.S. Appl. No. 17/339,754, Mailed Jul. 31, 2024, 9 pages.

* cited by examiner

MEMORY CHIP WITH PER ROW ACTIVATION COUNT HAVING ERROR CORRECTION CODE PROTECTION

CROSS-REFERENCE TO RELATED APPLICATION

This application is a continuation of U.S. application Ser. No. 17/339,754, filed Jun. 4, 2021. The entire specification of which is hereby incorporated herein by reference in its entirety.

FIELD OF THE INVENTION

The field of invention pertains to the computing sciences generally, and, more specifically, to a method and apparatus for memory chip with per row activation count with error correction code protection.

BACKGROUND

A Dynamic Random Access Memory (DRAM) cell stores charge in a capacitive cell. During a standby mode (when there is no access to the cell), charge can continually leak from a cell to the point where its stored value is changed (e.g., from a 1 to a 0).

In order to prevent such data loss, a DRAM memory chip is designed to refresh its storage cells. The refresh activity typically entails reading from a cell to detect its stored value and then writing the same value back into the cell. The write operation replenishes the cell with a fresh amount of charge for the particular stored value.

In order to guarantee the integrity of its data over an extended run time, a memory chip will periodically refresh its storage cells. Specifically, each cell in the memory chip's cell array will be refreshed with sufficient frequency to prevent the loss of its stored data even if the cell is frequently accessed.

A recently published Joint Electron Device Engineering Council (JEDEC) standard, dual data rate 5 ("DDR5"), defines cooperative refreshing behavior between a memory chip and the host (memory controller). Specifically, a memory chip manufacturer defines (in mode register (MR) space of a memory chip) certain timing requirements related to the refreshing of the cells in the memory chip's cell array.

The memory controller reads the timing requirements and schedules REFRESH commands according to a schedule that is consistent with the timing requirements. The memory controller then issues REFRESH commands to the memory chip consistent with the schedule. In response to each REFRESH command, the memory chip refreshes cells at array locations specified by the type of REFRESH command it receives (all banks in a particular bank group, or the same bank in all bank groups).

DRAM memory cells can also suffer from a data corruption mechanism referred to as "row hammer". In the case of row hammer, data can be corrupted in cells that are coupled to rows that are near (e.g., next to) a row that is frequently activated. As such, memory systems ideally include counters that monitor row activations. If a row is deemed to have received a number of activations over a time window that exceed a threshold, the cells that are coupled to the nearby rows are pro-actively refreshed to protect them against the row hammer effect.

The JEDEC DDR5 standard includes a row hammer mitigation approach referred to as "refresh management". In the case of refresh management, the memory controller counts row activations per bank. If the count for a bank exceeds a threshold specified by the memory chip manufacturer, the memory controller issues refresh management (RFM) commands to the memory chip.

In response to each RFM command, the memory chip refreshes cells at array locations specified by the type of RFM command it receives (all banks in a particular bank group, or same bank in all bank groups). Notably, refreshes performed in response to RFM commands are additional refreshes beyond the normal scheduled refreshes that are implemented with REFRESH commands as described above.

BRIEF DESCRIPTION OF DRAWINGS

A better understanding of the present invention can be obtained from the following detailed description in conjunction with the following drawings, in which.

DETAILED DESCRIPTION

Future generation memory chips are expected to be designed to include their own row hammer threat detection circuitry. For example, at least some future generation memory chips are expected to include additional DRAM cells per row that are used to hold that row's activation count.

Figure 1:
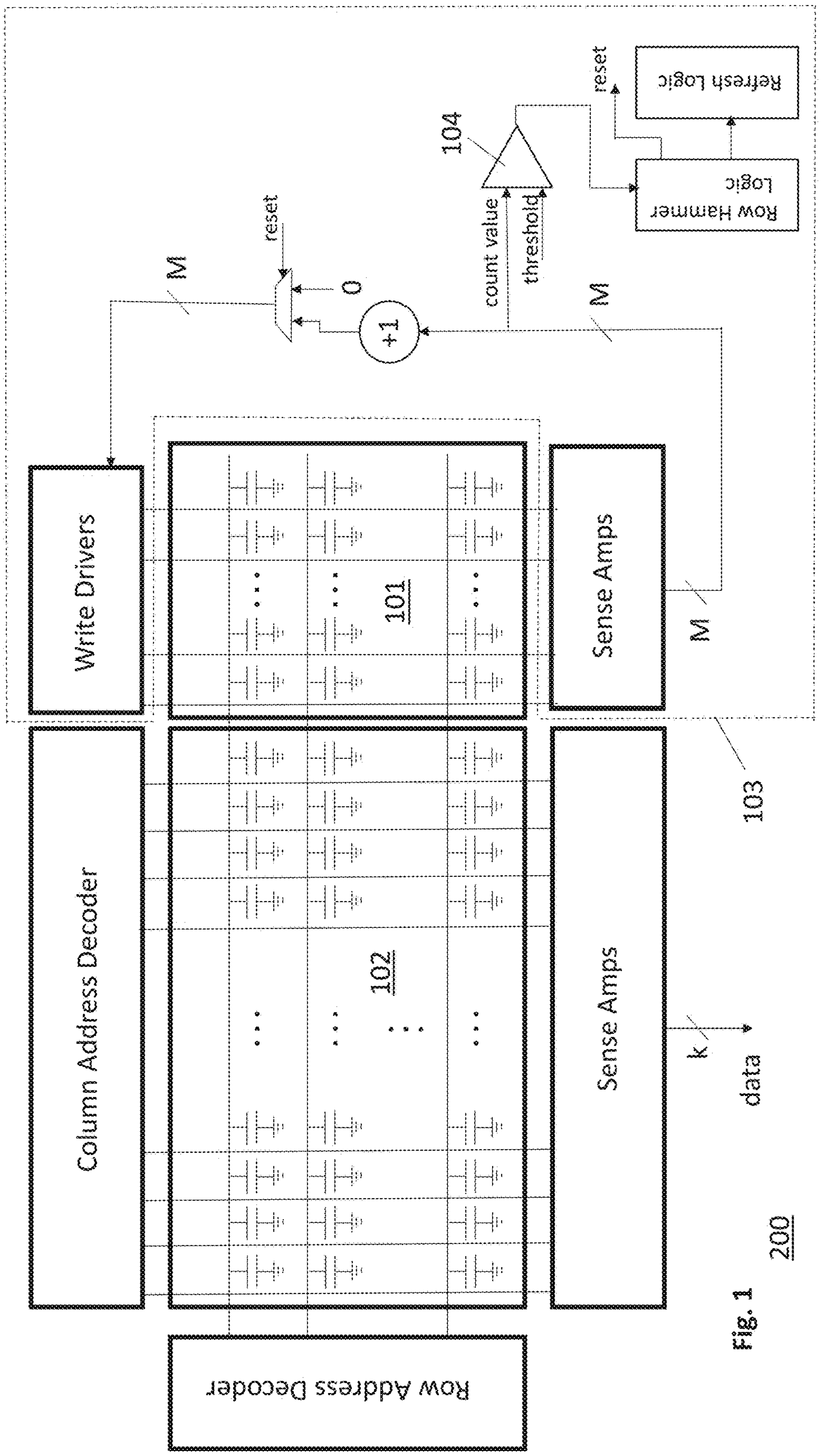
FIG. 1 depicts a memory chip having per row activation count.

FIG. 1 depicts a high level view of a memory chip 100 having additional cells 101 per row that are reserved for counting activations of the row. Here, as observed in FIG. 1, a core memory cell array 102 corresponds to a traditional memory array that stores, e.g., random customer data. Each row also includes a set of counter cells 101 that keep a count of the number of times their particular row has been activated since its last refresh. In operation, each time a row is activated, circuitry 103 within the memory chip reads the count value for the row, increments the count by 1, and then stores the updated value back in the counter cells.

The memory chip includes a comparator 104 that compares the count value against a threshold value. If the row activation count for any particular row reaches the threshold, the memory chip recognizes the existence of a row hammer threat for that particular row (which can be referred to as a "hammer row").

As discussed in the background, row hammer threats are mitigated by refreshing the possible victim rows of the hammer row. Generally, the possible victim rows of the hammer row are the hammer row's nearest neighbor rows. For example, a hammer row's set of possible victim rows could include the hammer row's immediately neighboring rows and their immediately neighboring rows (other than the hammer row). The precise number/set of possible victim rows depends on the memory chip's particular design and manufacturing technology.

Depending on implementation, once the count value is deemed to have reached the threshold and the memory chip recognizes the existence of a row hammer threat, the memory chip 200 an notify the memory controller of the threat and/or request the memory controller to issue RFM commands to handle the problem (the RFM commands should target the bank(s) where the possible victim rows reside). Alternatively or in combination, the memory chip 200 can initiate and perform refreshing of the possible victim rows without an explicit command from the memory controller.

Additionally, in response to the count value having been deemed to reach the threshold, the count value is reset (e.g., to 0) and stored back into the memory array. The process then repeats.

Other functional extensions can be added to these basic operations. However, such extensions also introduce complications that should be overcome if they are to be successfully integrated into the memory chip's functionality.

Figure 2:
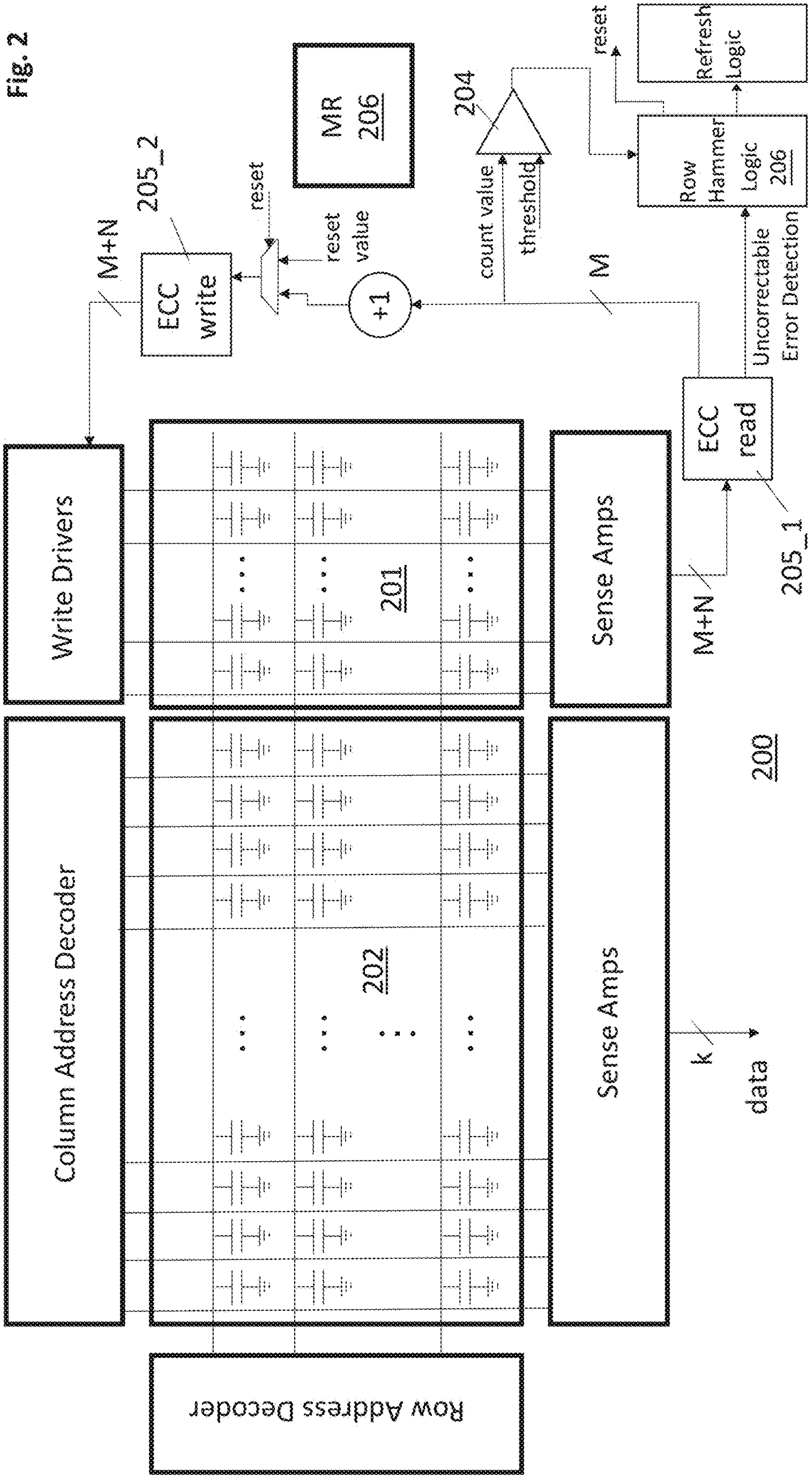
FIG. 2 depicts a memory chip having per row activation count with error correction code (ECC) protection.

A first functional extension, depicted in FIG. 2, is the addition of error correction code (ECC) information to the count value. Here, for example, if the count value is recorded with M bits per row, an additional N bits per row are used for ECC information (such that a total of M+N bits are reserved per row for activation counting purposes). The N bits of ECC information "protect" the M bit count value. Here, during a read of the count value (e.g., in order to increment the count value in response to a new activation of its corresponding row) both the M count value bits and the N ECC bits are read.

The M+N bits are then processed by ECC read logic circuitry 205_1 within the memory chip 200. If there is a corruption in a bit of the M+N bits, the ECC read logic circuitry 205_1 can correct the error. As such, the correct count value will be obtained (if the error was in the M bit count value, the ECC read logic circuitry 205_1 corrects the error; if the error was in the N bits of ECC information, the M bit count value was not corrupted).

After the correct count value is incremented, ECC write logic circuitry 205_2 processes the updated count value and determines a new set of N bits of ECC information for the updated count value. The incremented M bit count value and the newly calculated N bits of ECC information are then stored back into the memory array 201.

Various forms of ECC protection are possible and may vary from embodiment to embodiment. For example, in the case of "single error correct" (SEC), the ECC information can be used to correct a single bit error but cannot be used to correct or even detect a two bit error (if M=16, SEC is achieved if N=5). By contrast, in the case of "single error correct, double error detect" (SECDED), the ECC information can be used to correct a single bit error and can be used to detect, but not correct, a two bit error (if M=16, SECDED is achieved if N=6).

If an ECC approach is adopted where an error can be detected but not corrected (such as SECDED), in various embodiments, the detection of an error in the M+N bits that cannot be corrected can cause different responses by the memory chip 200, depending on implementation.

According to a first approach, the detection of an uncorrectable error automatically triggers row hammer mitigation of the possible victim rows for the row whose M+N bits has the uncorrectable error. Here, row hammer logic 206 causes the possible victim rows of the row having the count error to be refreshed.

This particular approach provides a high degree of protection against data loss from the row hammer effect. In essence, the approach assumes that one or more errors exist in the highest ordered bits of the M bit count value, or, said another way, the (unknown) correct count value is assumed to be at/near the threshold. As such, the memory chip 200 responds as if the threshold has been reached.

At the same time, this approach can impart a hit to memory performance. Here, the refreshing that is performed during row hammer mitigation prevents the memory chip 200 from responding to read/write requests, which, in turn, diminishes the memory chip's performance from the perspective of the larger system that the memory chip is a component of. That is, the automatic assumption that the count value is at/near the threshold causes unnecessary row hammer mitigations to be performed (when the assumption is incorrect) which prevents the memory from reaching its full performance.

Nevertheless, if uncorrectable row count errors occur at too frequent a rate, the memory controller is apt to notice that the memory is requiring too many row hammer mitigations (and/or refreshes) and can trigger a post-package repair (e.g., replace a portion of memory that includes the row experiencing the high rate of uncorrectable row activation count errors to another, spare portion of memory) or some other type of work around.

According to a second approach, no row hammer mitigation activity is performed in response to the activation count for a particular row suffering a detected but uncorrectable error. This approach results in better overall memory performance in that unnecessary refreshes are not performed. However, if in fact there is an error in a higher ordered bit of the M bit count value, the count value can be changed to a much lower value, which, in turn, could stress the possible victim rows well beyond the threshold.

How the comparator 204 determines whether the count value has been reached can influence which of the first or second approaches is more appropriate. For example, the first approach may be better if the threshold is deemed to be reached when the count value is greater than or equal to the threshold. For example, if the threshold is a value that is well below the maximum value that can be represented with the M bits, there is a greater chance that the bit in error corresponds to a higher ordered bit of the threshold value.

By contrast, if the threshold is deemed to be reached when the count value equals the threshold, the second approach may be better. In this case, the bit in error is apt to be a bit other than a higher ordered bit of the threshold, or, said another way, the incorrect count value is only a little less than its correct value. As such, it is better to keep operating with the incorrect value because it only results in a few additional row activations beyond the threshold before row hammer mitigation is performed based on the count value.

Some memory chips may be designed to select which type of approach is to be used after an uncorrectable error in the count value is detected, and/or, which type of comparison against the threshold triggers row hammer mitigation (e.g., greater than or equal, equal, etc.). Moreover, the approach may be established directly from a selection of comparison type (e.g., if greater than or equal to is selected, the first approach is automatically adopted, or, if equal to is selected, the second approach is automatically adopted). The comparison type and/or approach type to be used can be set by a host, e.g., in mode register (MR) space 206 of the memory chip 200.

Other complications concern the resetting of the counter value. As described above, the counter is reset when the count value reaches the threshold. In an extension, the count value is also reset if the row for the count value is refreshed by other means (e.g., in response to a scheduled REFRESH command or an RFM command).

However, the memory chip manufacturer, when articulating the refresh command timing information in its MR space 206, and/or the memory controller, should ensure that the possible victim rows of a row whose counter is reset because of a scheduled REFRESH command and/or an RFM command are also refreshed a short time later (e.g., by immediately following REFRESH or RFM commands). Here, the resetting of the counter in response to the refresh exposes the possible victim rows to additional activations of the row (beyond the threshold) which could cause the possible victim rows to actually suffer a row hammer fault.

As such, in various embodiments, the threshold value that is established for the memory (which can be specified, e.g., in MR space 206 of the memory chip 200 as a single value or range of values) is determined in light of the maximum amount of time that can elapse between scheduled REFRESH commands and/or between RFM commands for a row and its possible victim rows. The longer the time that can elapse, the lower the threshold should be set.

So doing allows more headroom for additional row activations beyond the threshold that the possible victim rows can withstand if long periods of time elapse between the refresh that resets the hammer row's counter and the refreshes that prevent the hammer row's possible victim rows from being victimized by the additional row activations.

Special consideration should also be given for repaired rows (which utilize redundant rows in a different physical location). If the memory cannot refresh the redundant row's possible victim rows shortly after the redundant row is refreshed, the redundant row's counter should not be reset when the redundant row is refreshed.

Another possible extension of the count value reset is to reset the counter to different, e.g., random values. That is, for example, rather than reset the counter to the same value (e.g., 0) each time it is reset, instead, reset the counter to one of a few or many values. So doing places some randomness into the row hammer refreshing activity, which, in turn, makes it harder for "attacker" program code (that was purposely written to induce row hammer faults) to be successful.

Another extension is to assign different thresholds for different possible victim rows of a hammer row. Here, a nearest neighbor of a hammer row is more susceptible to row hammer effects than rows that are two rows away from the hammer row, and so on. As such, a lower threshold can be established for the nearest neighbor rows than the farther away rows. As just one example, the possible victim rows that are farthest from a hammer row set the threshold value that triggers a reset of the hammer row's counter. Thresholds for nearer rows are then determined as fractions of this threshold value.

For example, if the farthest possible victim rows are three rows away, a threshold of 50,000 can be set for them. The threshold for the rows that are two rows away are set at ⅕ of this threshold (=10,000) and the threshold for the nearest neighbor rows are set at 1/10 of this threshold (=5,000). The memory chip's comparator 204 can then determine from the count value when any of the thresholds have been reached (the comparator 204 is designed to perform comparisons against all three thresholds). That is, for the nearest neighbor rows, the comparator 204 can detect when the count value reaches values of 5,000; 10,00; 15,000, etc. Likewise for the rows that are two rows away the comparator 204 can detect when the count value reaches values of 10,000; 20,000; 30,000, etc. Row hammer mitigation is then activated for rows of a particular distance from the hammer row when their particular threshold is reached.

The memory chip 200 can be designed to include MR space 206 that specifies the factors between differently distanced possible victim rows and/or the threshold value that triggers reset of the count value.

The ECC processing that is performed on the count value can consume time that delays a memory's ability to respond to a read or write request. Specifically, the ECC processing expands a memory chip's tRAS (the time from when a row is activated to when the row is deactivated). Here, the count value for the row should be updated within tRAS. Thus, if the ECC processing of the count value consumes too much time, it can have the effect of expanding tRAS to a greater amount of time than what would exist if the ECC were not present.

As such, some embodiments may choose to not include ECC information for the count value, or, may make ECC information for the count value a feature that can be enabled/disabled (e.g., through MR space 206 of the memory). Regardless, in various embodiments, if ECC information is not used for the count value, the count value is expressed in gray code. As is known in the art, with gray code there is only a one bit difference between successive values. As such, if a bit is in error, it can only cause the count value to be different than the correct count value by 1 (by contrast, with binary representations, there are instances where all of the bits are different between successive values).

Moreover, with the effect of an error being minimal because of the gray code, the tRAS of the memory can be pushed/minimized so that, even if the count value cannot be updated in time (the count value for the row could not be updated in the amount of time in which the count value's row was activated and then deactivated), the risk of row hammer effects is minimal (because the count value is only off by 1). The threshold can be lowered in various embodiments to provide some headroom for count values that are less than the actual row activation count due to tRAS being minimized.

Gray code can still be used in embodiments that use ECC protection.

In further embodiments, tRAS can be a function of temperature. Specifically, tRAS is lessened at higher temperatures and is increased at lower temperatures. Here, it can take longer for the count value to be written back when the memory chip is at a lower temperature. As such, tRAS is expanded at lower temperatures to give the memory chip more time to write back the updated count value. At higher temperatures the memory chip should need less time to write back the updated count value so tRAS can be lessened.

Here, the memory controller can read the memory die's internal temperature so it can comprehend the applicable tRAS (and provide corresponding signals to the memory chip). The memory chip can have MR space to indicate the appropriate tRAS as a function of die temperature.

Figure 3:
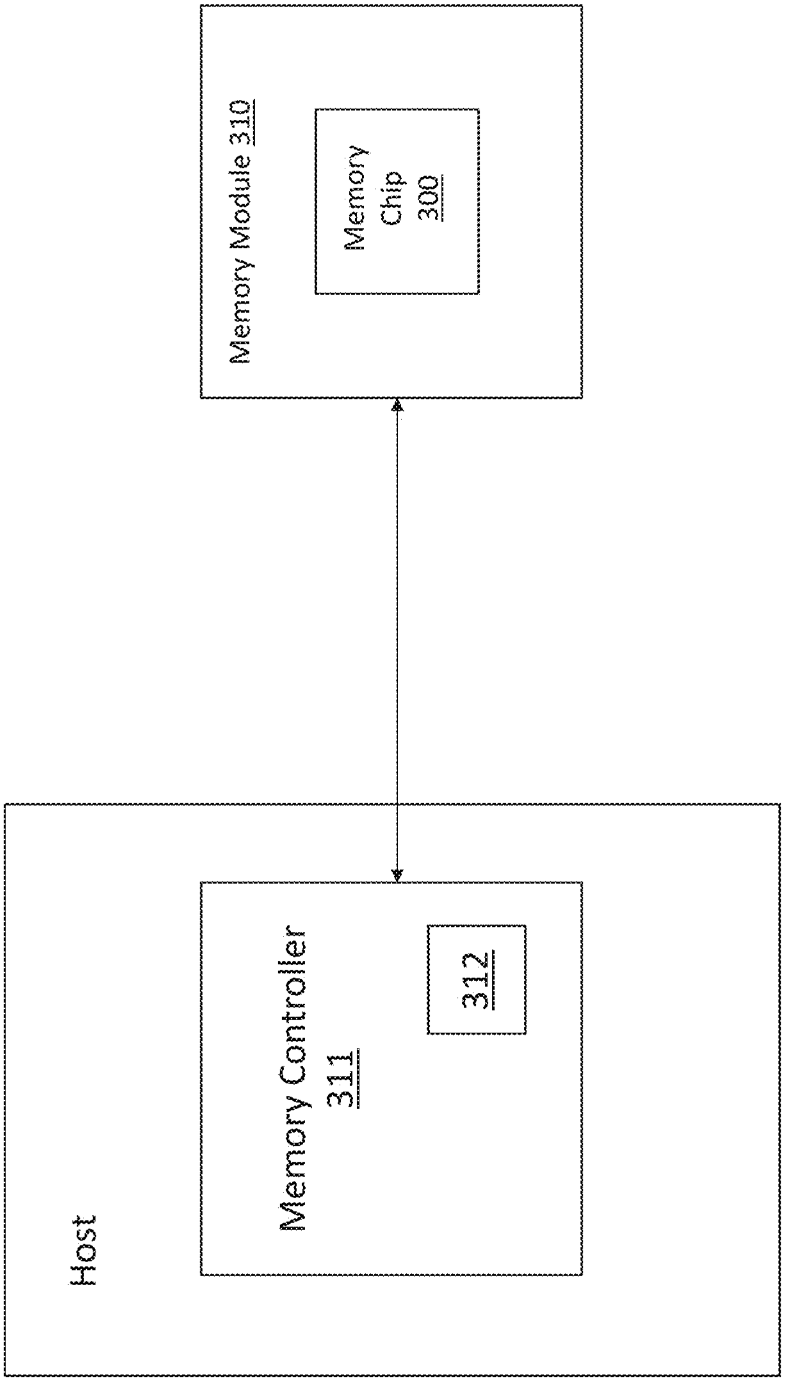
FIG. 3 shows a memory controller coupled to a memory chip having per row activation count with error correction code (ECC) protection.

FIG. 3 shows a memory controller 311 that is communicatively coupled to a memory module 310 having a memory chip 300 as described just above. The memory module can be in any of a number of different form factors such as a dual-in line memory module (DIMM), a stacked memory chip memory module, etc. The memory controller includes special logic circuitry 312 to be operationally compatible with the memory chip 300. For instance, logic circuitry 312 causes the memory controller to: 1) notice that the memory chip 300 is requiring too many row hammer mitigations (and/or refreshes) and trigger a post-package repair or some other type of work around; 2) ensure that the possible victim rows of a row whose counter is reset because of a scheduled REFRESH command and/or an RFM command are also refreshed a short time later (e.g., by immediately following REFRESH or RFM commands); 3) read the memory die's internal temperature so it can comprehend the applicable tRAS (and provide corresponding signals to the memory chip). A host that the memory controller 311 is a component of can perform any of these operations. Additionally, the memory controller 311 and/or host can read and/or set the memory chip MR space having any of the MR space information described above.

The teachings provided above can be applied to various memory implementations including JEDEC DDR5 implementations, JEDEC DDR6 implementations, JEDEC graphics DDR (GDDR) implementations, JEDEC High Bandwidth Memory (HBM) implementations, JEDEC LPDDR5 implementations, JEDEC LPDDR6 implementations, etc.

Although embodiments above have been directed to a DRAM memory chip, it is conceivable that the approaches/extensions described herein can be applied to other memory technologies that exhibit row hammer corruption or otherwise can make use of counting any of row activations, row accesses and/or the like. Various types of solid state memory technologies include flash memory and three-dimensional, resistive cell non volatile memory (e.g., phase change memory, dielectric memory, magnetic memory, etc.). In the case of the later, the storage cells are generally formed as a three dimensional array that is integrated within the wiring layers above the chip's substrate.

The various types of circuitry described above can be implemented, at least partially, with logic circuitry. Logic circuitry can include logic gates and/or larger logic macros formed with such logic gates that are dedicated and hardwired, programmable or configurable logic circuitry such as field programmable gate array (FPGA) circuitry and/or circuitry design to execute some form of program code (e.g., micro-controller).

Figure 4:
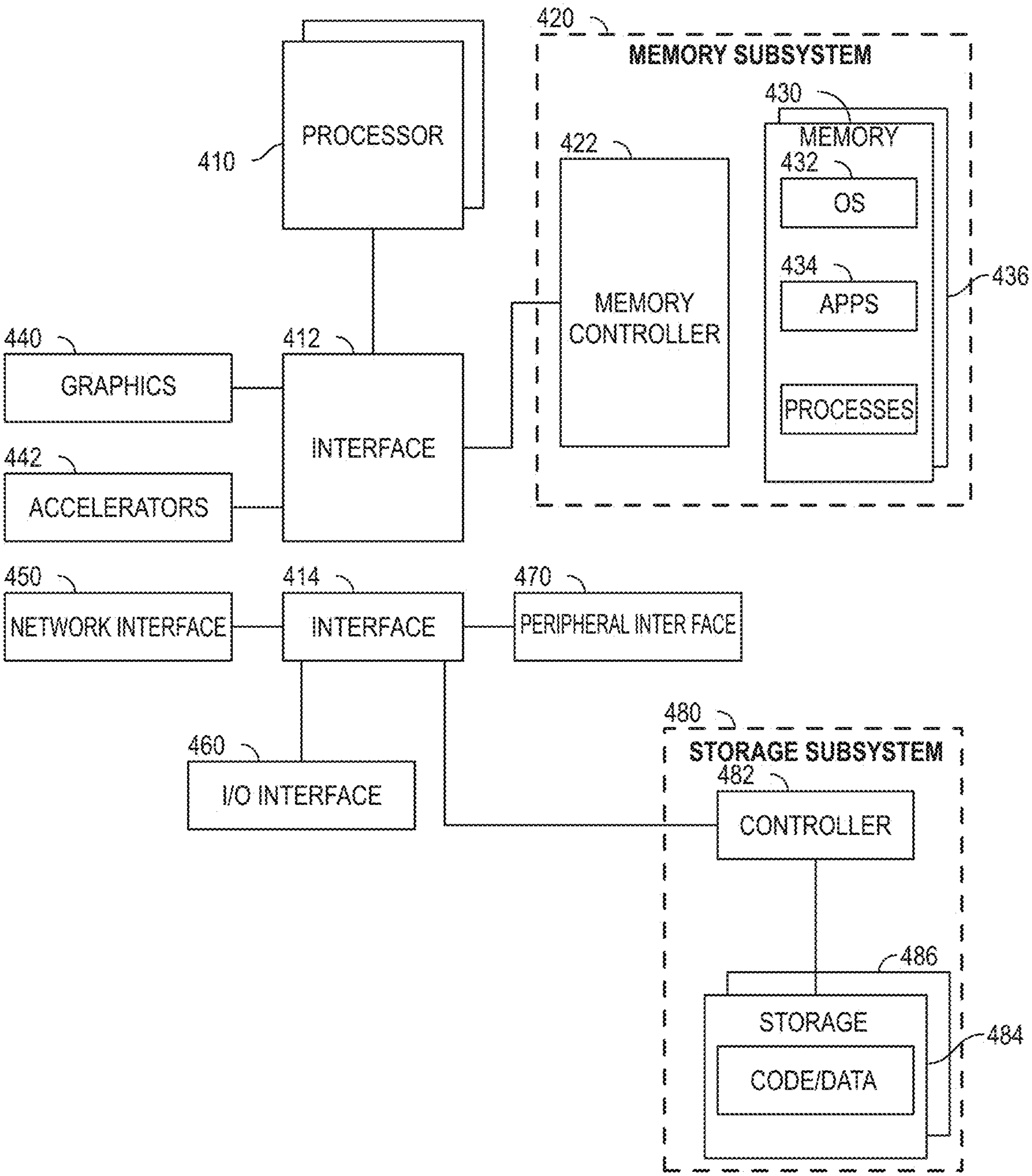
FIG. 4 shows a system.

FIG. 4 depicts an example system. The system can use the teachings provided herein. System 400 includes processor 410, which provides processing, operation management, and execution of instructions for system 400. Processor 410 can include any type of microprocessor, central processing unit (CPU), graphics processing unit (GPU), processing core, or other processing hardware to provide processing for system 400, or a combination of processors. Processor 410 controls the overall operation of system 400, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 400 includes interface 412 coupled to processor 410, which can represent a higher speed interface or a high throughput interface for system components that needs higher bandwidth connections, such as memory subsystem 420 or graphics interface components 440, or accelerators 442. Interface 412 represents an interface circuit, which can be a standalone component or integrated onto a processor die. Where present, graphics interface 440 interfaces to graphics components for providing a visual display to a user of system 400. In one example, graphics interface 440 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 440 generates a display based on data stored in memory 430 or based on operations executed by processor 410 or both. In one example, graphics interface 440 generates a display based on data stored in memory 430 or based on operations executed by processor 410 or both.

Accelerators 442 can be a fixed function offload engine that can be accessed or used by a processor 410. For example, an accelerator among accelerators 442 can provide compression (DC) capability, cryptography services such as public key encryption (PKE), cipher, hash/authentication capabilities, decryption, or other capabilities or services. In some embodiments, in addition or alternatively, an accelerator among accelerators 442 provides field select controller capabilities as described herein. In some cases, accelerators 442 can be integrated into a CPU socket (e.g., a connector to a motherboard or circuit board that includes a CPU and provides an electrical interface with the CPU). For example, accelerators 442 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic, and programmable processing elements such as field programmable gate arrays (FPGAs). Accelerators 442 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 420 represents the main memory of system 400 and provides storage for code to be executed by processor 410, or data values to be used in executing a routine. Memory subsystem 420 can include one or more memory devices 430 such as read-only memory (ROM), flash memory, volatile memory, or a combination of such devices.

Memory 430 stores and hosts, among other things, operating system (OS) 432 to provide a software platform for execution of instructions in system 400. Additionally, applications 434 can execute on the software platform of OS 432 from memory 430. Applications 434 represent programs that have their own operational logic to perform execution of one or more functions. Processes 436 represent agents or routines that provide auxiliary functions to OS 432 or one or more applications 434 or a combination. OS 432, applications 434, and processes 436 provide software logic to provide functions for system 400. In one example, memory subsystem 420 includes memory controller 422, which is a memory controller to generate and issue commands to memory 430. It will be understood that memory controller 422 could be a physical part of processor 410 or a physical part of interface 412. For example, memory controller 422 can be an integrated memory controller, integrated onto a circuit with processor 410. In some examples, a system on chip (SOC or SoC) combines into one SoC package one or more of: processors, graphics, memory, memory controller, and Input/Output (I/O) control logic.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version 3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

The memory 430 could include one or more of the extensions described at length above.

While not specifically illustrated, it will be understood that system 400 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (ISCSI), NVM express (NVMe), Coherent Accelerator Interface (CXL), Coherent Accelerator Processor Interface (CAPI), a universal serial bus (USB), or an Institute of Electrical and Electronics Engineers (IEEE) standard 1394 bus.

In one example, system 400 includes interface 414, which can be coupled to interface 412. In one example, interface 414 represents an interface circuit, which can include standalone components and integrated circuitry. In one example, multiple user interface components or peripheral components, or both, couple to interface 414. Network interface 450 provides system 400 the ability to communicate with remote devices (e.g., servers or other computing devices) over one or more networks. Network interface 450 can include an Ethernet adapter, wireless interconnection components, cellular network interconnection components, USB (universal serial bus), or other wired or wireless standards-based or proprietary interfaces. Network interface 450 can transmit data to a remote device, which can include sending data stored in memory. Network interface 450 can receive data from a remote device, which can include storing received data into memory. Various embodiments can be used in connection with network interface 450, processor 410, and memory subsystem 420.

In one example, system 400 includes one or more input/output (I/O) interface(s) 460. I/O interface 460 can include one or more interface components through which a user interacts with system 400 (e.g., audio, alphanumeric, tactile/touch, or other interfacing). Peripheral interface 470 can include any hardware interface not specifically mentioned above. Peripherals refer generally to devices that connect dependently to system 400. A dependent connection is one where system 400 provides the software platform or hardware platform or both on which operation executes, and with which a user interacts.

In one example, system 400 includes storage subsystem 480 to store data in a nonvolatile manner. In one example, in certain system implementations, at least certain components of storage 480 can overlap with components of memory subsystem 420. Storage subsystem 480 includes storage device(s) 484, which can be or include any conventional medium for storing large amounts of data in a non-volatile manner, such as one or more magnetic, solid state, or optical based disks, or a combination. Storage 484 holds code or instructions and data 486 in a persistent state (e.g., the value is retained despite interruption of power to system 400). Storage 484 can be generically considered to be a "memory," although memory 430 is typically the executing or operating memory to provide instructions to processor 410. Whereas storage 484 is nonvolatile, memory 430 can include volatile memory (e.g., the value or state of the data is indeterminate if power is interrupted to system 400). In one example, storage subsystem 480 includes controller 482 to interface with storage 484. In one example controller 482 is a physical part of interface 414 or processor 410 or can include circuits or logic in both processor 410 and interface 414.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 400. More specifically, power source typically interfaces to one or multiple power supplies in system 400 to provide power to the components of system 400. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 400 can be implemented as a disaggregated computing system. For example, the system 400 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Figure 5:
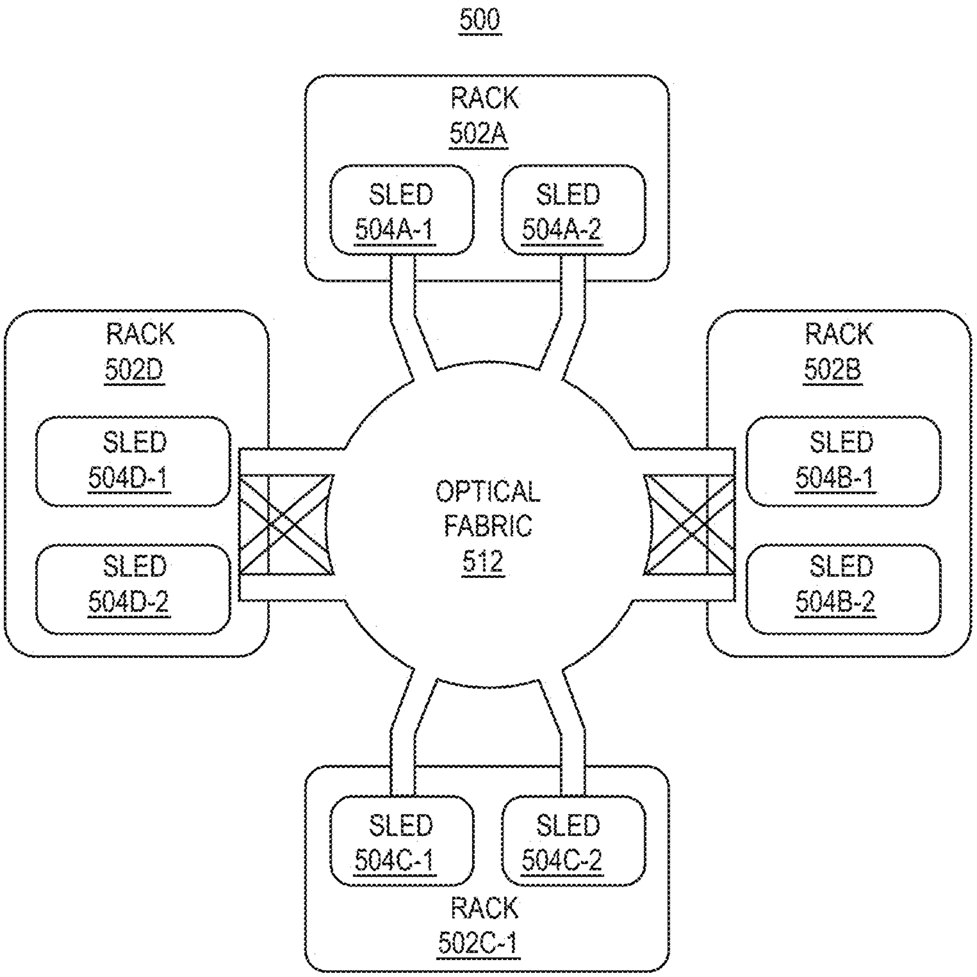
FIG. 5 shows a data center.

FIG. 5 depicts an example of a data center. Various embodiments can be used in or with the data center of FIG. 5. As shown in FIG. 5, data center 500 may include an optical fabric 512. Optical fabric 512 may generally include a combination of optical signaling media (such as optical cabling) and optical switching infrastructure via which any particular sled in data center 500 can send signals to (and receive signals from) the other sleds in data center 500. However, optical, wireless, and/or electrical signals can be transmitted using fabric 512. The signaling connectivity that optical fabric 512 provides to any given sled may include connectivity both to other sleds in a same rack and sleds in other racks. Data center 500 includes four racks 502A to 502D and racks 502A to 502D house respective pairs of sleds 504A-1 and 504A-2, 504B-1 and 504B-2, 504C-1 and 504C-2, and 504D-1 and 504D-2. Thus, in this example, data center 500 includes a total of eight sleds. Optical fabric 512 can provide sled signaling connectivity with one or more of the seven other sleds. For example, via optical fabric 512, sled 504A-1 in rack 502A may possess signaling connectivity with sled 504A-2 in rack 502A, as well as the six other sleds 504B-1, 504B-2, 504C-1, 504C-2, 504D-1, and 504D-2 that are distributed among the other racks 502B, 502C, and 502D of data center 500. The embodiments are not limited to this example. For example, fabric 512 can provide optical and/or electrical signaling.

Figure 6:
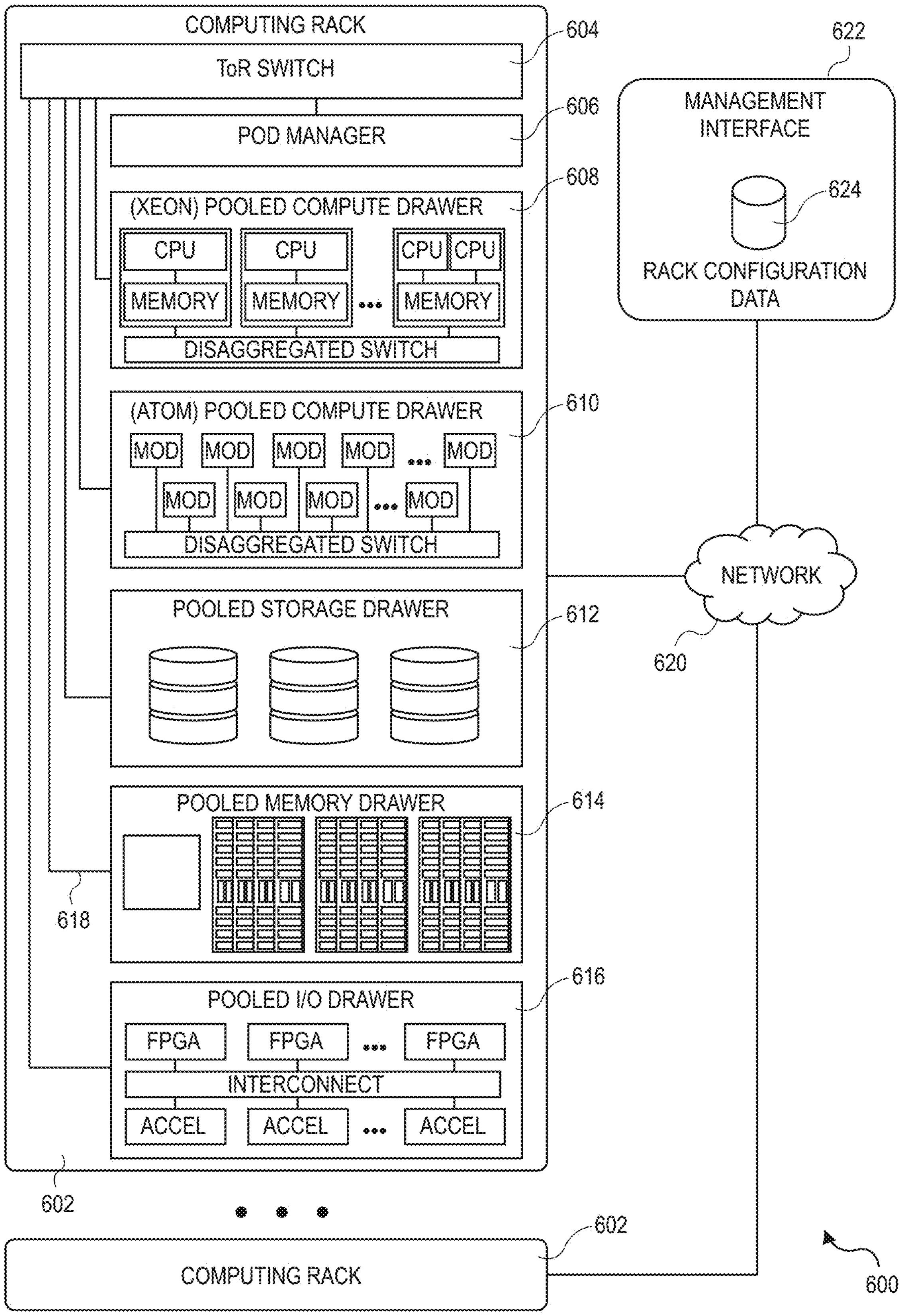
FIG. 6 shows an environment.

FIG. 6 depicts an environment 600 includes multiple computing racks 602, each including a Top of Rack (ToR) switch 604, a pod manager 606, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 608, and INTEL® ATOM™ pooled compute drawer 610, a pooled storage drawer 612, a pooled memory drawer 614, and an pooled I/O drawer 616. Each of the pooled system drawers is connected to TOR switch 604 via a high-speed link 618, such as a 40 Gigabit/second (Gb/s) or 100 Gb/s Ethernet link or an 100+Gb/s Silicon Photonics (SiPh) optical link. In one embodiment high-speed link 618 comprises an 800 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 600 may be interconnected via their TOR switches 604 (e.g., to a pod-level switch or data center switch), as illustrated by connections to a network 620. In some embodiments, groups of computing racks 602 are managed as separate pods via pod manager(s) 606. In one embodiment, a single pod manager is used to manage all of the racks in the pod. Alternatively, distributed pod managers may be used for pod management operations.

RSD environment 600 further includes a management interface 622 that is used to manage various aspects of the RSD environment. This includes managing rack configuration, with corresponding parameters stored as rack configuration data 624.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," "logic," "circuit," or "circuitry."

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The invention claimed is:

1. A memory chip, comprising:
- a storage array having a plurality of rows individually configured to include storage cells to store a count value of a respective row's activations and to store error correction code (ECC) information; and
- circuitry configured to:
  - correct a detected error in a count value of a row from among the plurality of rows;
  - increment the count value if the count value is below a threshold;
  - determine new ECC information for the incremented count value; and
  - write the incremented count value and the new ECC information into the row's storage cells.

2. The memory chip of claim 1, wherein the circuitry is further configured to:
- cause the row to be refreshed if the count value has reached the threshold.

3. The memory chip of claim 1, further comprising:
- a mode register space configurable by a memory controller to cause the count value to be reset to different values.

4. The memory chip of claim 1, wherein the circuitry is configured to detect more than one error in the count value but cannot correct the count value having more than one detected error.

5. The memory chip of claim 4, wherein the circuitry is further configured to:
- automatically cause the row to be refreshed based on the count value having uncorrectable errors.

6. The memory chip of claim 4, wherein the circuitry is further configured to:
- not cause a refresh of the row in response to the count value having uncorrectable errors.

7. The memory chip of claim 1, further comprising:
- a mode register space configurable to set at least one of:
  - a type of comparison used to determine if the count value is below the threshold;
  - a response to an uncorrectable error in the count value.

8. The memory chip of claim 1, wherein a memory controller coupled with the memory chip comprises logic circuitry to reset the count value as a consequence of the row having been refreshed for a reason other than the count value being determined as reaching or exceeding the threshold.

9. The memory chip of claim 8, wherein the threshold is at least partially based on when possible victim rows of the row will be refreshed after the row is refreshed for a reason other than the count value being determined as reaching the threshold.

10. The memory chip of claim 1, wherein the threshold is only for possible victim rows of the row having a specific distance from the row and not for other possible victim rows of the row having a different specific distance from the row.

11. The memory chip of claim 1, wherein the count value is expressed in gray code.

12. The memory chip of claim 1, wherein the memory chip's tRAS is variable based on the memory chip's temperature.

13. A system, comprising:

a plurality of processing cores;

a peripheral controller;

a memory controller coupled to the plurality of processing cores;

a memory module coupled to the memory controller, the memory module including a memory chip, the memory chip to include:

a storage array having a plurality of rows individually configured to include storage cells to store a count value of a respective row's activations and to store error correction code (ECC) information; and circuitry configured to:

correct a detected error in a count value of a row from among the plurality of rows;

increment the count value if the count value is below a threshold;

determine new ECC information for the incremented count value; and write the incremented count value and the new ECC information into the row's storage cells.

14. The system of claim 13, wherein the circuitry of the memory chip is further configured to:

cause the row to be refreshed if the count value has reached the threshold.

15. The system of claim 13, wherein the memory chip further includes:

a mode register space configurable by the memory controller to cause the count value to be reset to different values.

16. The system of claim 13, wherein the circuitry of the memory chip is configured to detect more than one error in the count value but cannot correct the count value having more than one detected error.

17. The system of claim 16, wherein the circuitry of the memory chip is further configured to:

automatically cause the row to be refreshed based on the count value having uncorrectable errors.

18. The system of claim 16, wherein the circuitry of the memory chip is further configured to:

not cause a refresh of the row in response to the count value having uncorrectable errors.

19. The system of claim 13, wherein the memory controller includes logic circuitry configured to reset the count value as a consequence of the row having been refreshed for a reason other than the count value being determined as reaching or exceeding the threshold.

20. The system of claim 13, wherein the threshold is only for possible victim rows of the row having a specific distance from the row and not for other possible victim rows of the row having a different specific distance from the row.

* * * * *